(12) United States Patent
Park et al.

(10) Patent No.: US 8,581,270 B2
(45) Date of Patent: Nov. 12, 2013

(54) ORGANIC LIGHT-EMITTING DISPLAY APPARATUS

(75) Inventors: Jin-Woo Park, Yongin (KR); Myung-Jong Jung, Yongin (KR); Tae-Min Kang, Yongin (KR); Sang-Woo Pyo, Yongin (KR); Beom-Joon Kim, Yongin (KR); Hyo-Yeon Kim, Yongin (KR)

(73) Assignee: Samsung Display Co., Ltd. (KR)

( * ) Notice: Subject to any disclaimer, the term of this patent is extended or adjusted under 35 U.S.C. 154(b) by 123 days.

(21) Appl. No.: 13/069,039

(22) Filed: Mar. 22, 2011

(65) Prior Publication Data

US 2011/0240970 A1   Oct. 6, 2011

(30) Foreign Application Priority Data

Mar. 31, 2010   (KR) .................. 10-2010-0029344

(51) Int. Cl.
*H01L 29/20*   (2006.01)
(52) U.S. Cl.
USPC .. 257/89; 257/40; 257/E51.022; 257/E51.041
(58) Field of Classification Search
USPC ................. 257/40, 89, E51.022, E51.041
See application file for complete search history.

(56) References Cited

U.S. PATENT DOCUMENTS

| | | | |
|---|---|---|---|
| 7,825,584 B2 | 11/2010 | Kim | |
| 2004/0032214 A1 | 2/2004 | Lee et al. | |
| 2005/0142384 A1 | 6/2005 | Itai | |
| 2005/0186330 A1 | 8/2005 | Kim et al. | |

(Continued)

FOREIGN PATENT DOCUMENTS

| | | |
|---|---|---|
| JP | 2008300503 | 12/2008 |
| JP | 2010034042 | 2/2010 |

(Continued)

OTHER PUBLICATIONS

Extended European Search Report issued on Nov. 25, 2011 in corresponding European Application No. 11160356.9.

(Continued)

*Primary Examiner* — Marvin Payen
(74) *Attorney, Agent, or Firm* — Knobbe Martens Olson & Bear LLP

(57) ABSTRACT

An organic light-emitting display apparatus is disclosed. The organic light-emitting display apparatus includes a first sub-pixel, a second sub-pixel, and a third sub-pixel, where each of said first, second and third sub-pixels displays a different color, a substrate, a first electrode disposed on the substrate, a second electrode disposed on the first electrode, facing the first electrode, an organic emission layer disposed between the first electrode and the second electrode, including a first organic emission layer, a second organic emission layer, and a third organic emission layer, and an electron acceptor layer disposed between the first electrode and the second electrode configured to contact the organic emission layer, where the first organic emission layer is disposed in the first sub-pixel, the second organic emission layer is disposed in the second sub-pixel, and the third organic emission layer is commonly disposed over the first sub-pixel, the second sub-pixel, and the third sub-pixel, and where the electron acceptor layer is disposed between the first organic emission layer and the third organic emission layer in the first sub-pixel and between the second organic emission layer and the third organic emission layer in the second sub-pixel.

11 Claims, 2 Drawing Sheets

(56) References Cited

U.S. PATENT DOCUMENTS

| | | |
|---|---|---|
| 2006/0226770 A1 | 10/2006 | Lee et al. |
| 2007/0046185 A1* | 3/2007 | Kim .............................. 313/504 |
| 2007/0298263 A1 | 12/2007 | Tonotani et al. |
| 2009/0079342 A1 | 3/2009 | Kumaki et al. |
| 2009/0191427 A1 | 7/2009 | Liao et al. |
| 2009/0242911 A1 | 10/2009 | Ishihara et al. |
| 2011/0127561 A1 | 6/2011 | Ide et al. |

FOREIGN PATENT DOCUMENTS

| | | |
|---|---|---|
| JP | 2010-056077 | 3/2010 |
| KR | 1020030015611 A | 2/2003 |
| KR | 1020040070171 A | 8/2004 |
| KR | 1020040104225 A | 12/2004 |
| KR | 1020050082644 A | 8/2005 |
| KR | 1020060002730 A | 1/2006 |
| KR | 1020070024286 | 2/2007 |
| KR | 1020070096760 A | 10/2007 |

OTHER PUBLICATIONS

Registration Determination Certificate dated Mar. 26, 2012 in Korean priority Patent Application No. 10-2010-0029344.

Korean Office Action dated Jul. 25, 2011 in Korean Priority Application No. 10-2010-0029344.

* cited by examiner

ORGANIC LIGHT-EMITTING DISPLAY APPARATUS

CROSS-REFERENCE TO RELATED APPLICATIONS

This application claims the benefit of Korean Patent Application No. 10-2010-0029344, filed on Mar. 31, 2010, in the Korean Intellectual Property Office, the disclosure of which is incorporated herein in its entirety by reference.

BACKGROUND

1. Field

The present disclosure relates to an organic light-emitting display apparatus that improves image quality and life.

2. Description of the Related Technology

Recently, display apparatuses have been replaced by portable thin flat panel display apparatuses. An organic or inorganic light-emitting display apparatus, a type of thin flat panel display apparatus, is a self-emission display apparatus. An organic or inorganic light-emitting display apparatus generally has a wide view angle, excellent contrast, and quick response speeds. Also, an organic light emitting display apparatus, in which a light emitting layer is formed of an organic material, generally has excellent luminance, driving voltage, and response speed, as compared to an inorganic light emitting display apparatus, and displays multi-colors.

In an organic light-emitting display apparatus, an organic emission layer is typically interposed between a cathode and an anode, and, when a voltage is applied to the cathode and the anode, the organic emission layer connected to the cathode and the anode emits visible light.

The organic emission layer typically includes an organic emission layer emitting different colors of visible light such as red, green, or blue. In the organic emission layer, holes and electrons are recombined, thereby emitting visible light. Surplus electrons that do not participate in the recombination typically move toward a hole injection layer (HIL), a hole transport layer (HTL) or a first electrode, thereby resulting in deterioration of light efficiency and life of an organic light-emitting display apparatus.

In a structure in which a blue organic emission layer is commonly used in all sub-pixels, the surplus electrons generate visible light in an undesirable organic emission layer, and thus color mixture occurs, thereby resulting in deterioration of image quality. Therefore, it is generally difficult to improve the image quality.

SUMMARY OF CERTAIN INVENTIVE ASPECTS

One aspect is an organic light-emitting display apparatus including: a first sub-pixel, a second sub-pixel, and a third sub-pixel, where each of said first, second and third sub-pixels displays a different color, a substrate, a first electrode disposed on the substrate, a second electrode disposed on the first electrode, facing the first electrode, an organic emission layer disposed between the first electrode and the second electrode, including a first organic emission layer, a second organic emission layer, and a third organic emission layer, and an electron acceptor layer disposed between the first electrode and the second electrode configured to contact the organic emission layer, where the first organic emission layer is disposed in the first sub-pixel, the second organic emission layer is disposed in the second sub-pixel, and the third organic emission layer is commonly disposed over the first sub-pixel, the second sub-pixel, and the third sub-pixel, and where the electron acceptor layer is disposed between the first organic emission layer and the third organic emission layer in the first sub-pixel and between the second organic emission layer and the third organic emission layer in the second sub-pixel.

Another aspect is an organic light-emitting display apparatus including: a first sub-pixel, a second sub-pixel, and a third sub-pixel, where each of said first, second and third sub-pixels displays a different color, a first electrode, a second electrode disposed on the first electrode, facing the first electrode, an organic emission layer disposed between the first electrode and the second electrode, including a first organic emission sublayer, a second organic emission sublayer, and a third organic emission sublayer, an electron acceptor layer disposed between the first electrode and the second electrode configured to contact the organic emission layer, where the first organic emission sublayer is disposed in the first sub-pixel, the second organic emission sublayer is disposed in the second sub-pixel, and the third organic emission sublayer is commonly disposed over the first sub-pixel, the second sub-pixel, and the third sub-pixel, and where the electron acceptor layer is disposed between the first organic emission sublayer and the third organic emission sublayer in the first sub-pixel and between the second organic emission sublayer and the third organic emission sublayer in the second sub-pixel, and a buffer layer between the electron acceptor layer and the first organic emission sublayer, and between the electron acceptor layer and the second organic emission sublayer.

Another aspect is an organic light-emitting display apparatus, including: a first sub-pixel, which includes a first electrode, a third organic emission layer, an electron acceptor layer, a first organic emission layer, and a second electrode, a second sub-pixel, which includes another first electrode, said third organic emission layer, another electron acceptor layer, a second organic emission layer, and said second electrode, and a third sub-pixel, which includes yet another first electrode, said third organic emission layer, and said second electrode, where each of said first, second and third sub-pixels displays a different color.

BRIEF DESCRIPTION OF THE DRAWINGS

The above and other features and advantages will become more apparent by describing in detail exemplary embodiments with reference to the attached drawings in which.

DETAILED DESCRIPTION OF CERTAIN INVENTIVE EMBODIMENTS

Figure 1:
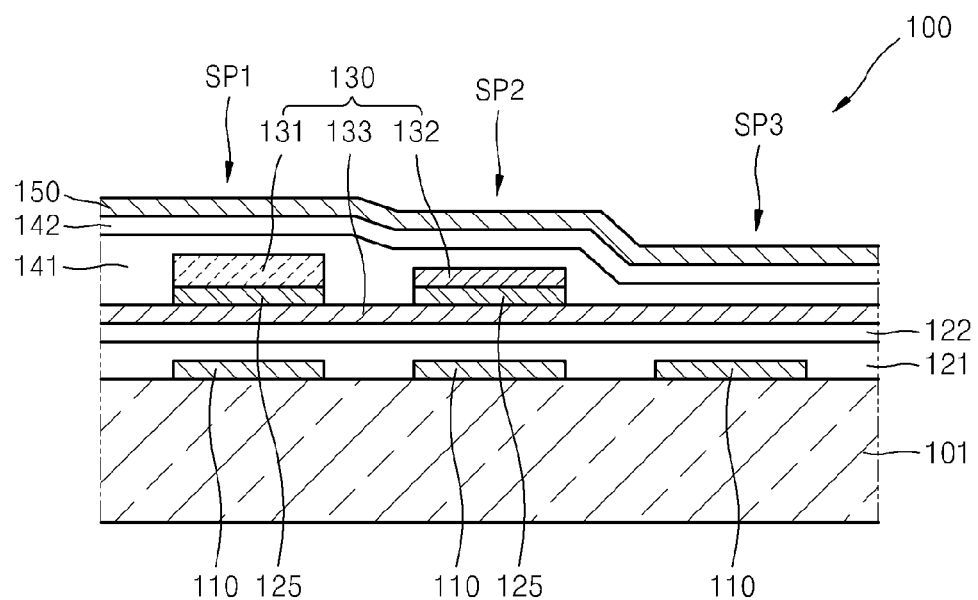
FIG. 1 is a schematic cross-sectional view of an embodiment of an organic light-emitting display apparatus.

FIG. 1 is a schematic cross-sectional view of an embodiment of an organic light-emitting display apparatus 100.

The organic light-emitting display apparatus 100 includes a first sub-pixel SP1, a second sub-pixel SP2, and a third sub-pixel SP3. The sub-pixels SP1, SP2, and SP3 may be different in color. In one embodiment, the first sub-pixel SP1 may be a red sub-pixel, the second sub-pixel SP2 may be a green sub-pixel, and the third sub-pixel SP3 may be a blue sub-pixel.

In the embodiment of FIG. 1, one first sub-pixel SP1, one second sub-pixel SP2, and one third sub-pixel SP3 are illustrated. In other embodiments, the organic light-emitting display apparatus 100 may include a plurality of first sub-pixels SP1, a plurality of second sub-pixels SP2, and a plurality of third sub-pixels SP3.

The first sub-pixel SP1 includes a first electrode 110, a third organic emission layer 133, an electron acceptor layer 125, a first organic emission layer 131, and a second electrode 150. The second sub-pixel SP2 includes a first electrode 110, the third organic emission layer 133, an electron acceptor layer 125, a second organic emission layer 132, and the second electrode 150. The third sub-pixel SP3 includes a first electrode 110, the third organic emission layer 133, and the second electrode 150.

In some embodiments, a substrate 101 may be formed of a transparent glass consisting SiO2 as a main component. In other embodiments, the substrate 101 may be formed of a transparent plastic material. The transparent plastic material may be an organic material selected from the insulating organic material group consisting of polyethersulphone (PES), polyacrylate (PAR), polyetherimide (PEI), polyethyelenen napthalate (PEN), polyethyeleneterepthalate (PET), polyphenylene sulfide (PPS), polyallylate, polyimide, polycarbonate (PC), cellulose triacetate (TAC), cellulose acetate propionate (CAP) and the like.

In yet other embodiments, the substrate 101 may be formed of a metal. In such embodiments, the substrate 101 may include at least one selected from the group consisting of carbon (C), steel (Fe), chrome (Cr), manganese (Mn), nickel (Ni), titanium (Ti), molybdenum (Mo), stainless steel (SUS), an invar alloy, an inconel alloy, a kovar alloy and the like. In other embodiments, the substrate 101 may be formed of metal foil.

A passivation layer (not shown) may be formed on the substrate 101 so as to prevent impurities from entering the substrate 101. The passivation layer may be formed of $SiO_2$ and/or $SiN_x$.

The first electrode 110 may be formed in a predetermined pattern by photolithography. In various embodiments, the first electrode 110 may be a reflective electrode or a transmissive electrode. In embodiments where the first electrode 110 is a reflective electrode, a reflective layer may be formed of one material selected from the group consisting of silver (Ag), magnesium (Mg), aluminum (Al), platinum (Pt), palladium (Pd), gold (Au), Ni, neodymium (Nd), iridium (Ir), Cr, lithium (Li), calcium (Ca), and the like, or a combination thereof. A material selected from ITO, IZO, ZnO or $In_2O_3$ having a high work function may be disposed on the reflective layer, thereby forming the first electrode 110.

In one embodiment, the first electrode 110 and the second electrode 150 are an anode and a cathode, respectively. In another embodiment, polarities thereof may be reversed.

Still referring to FIG. 1, a hole injection layer 121 and a hole transport layer 122 are formed on the first electrode 110. In other embodiments, the hole injection layer 121 and the hole transport layer 122 may not be formed, or only one of them may be formed.

An organic emission layer 130 is formed on the hole transport layer 122. The organic emission layer 130 includes a first organic emission layer 131, a second organic emission layer 132, and a third organic emission layer 133.

In the embodiment shown in FIG. 1, the third organic emission layer 133 is formed on the hole transport layer 122 across all of the first sub-pixel SP1, the second sub-pixel SP2, and the third sub-pixel SP3.

In the embodiment shown, the third organic emission layer 133 emits blue visible light and may include oxadiazole dimer dyes (Bis-DAPDXP), spiro compounds (Spiro-DPVBi, Spiro-6P), triarylamine compounds, bis(styryl) amine (DPVBi, DSA), 4,4'-bis(9-ethyl-3-vinylene)-1,1'-biphenyl (BCzVBi), perylene, 2,5,8,11-tetra-tert-butylperylene (TPBe), 9H-carbazole-3,3'-1,4-phenylene-di-2,1-ethene-diyl)bis[9-ethyl-(9C)] (BCzVB), 4,4-bis[4-(di-p-tolylamino)styryl]biphenyl (DPAVBi), 4-(di-p-tolylamino)-4'-[(di-p-tolylamino)styryl]stilbene (DPAVB), 4,4'-bis[4-(diphenylamino)styryl]biphenyl (BDAVBi), b is 3,5-difluoro-2-(2-pyridyl)phenyl-(2-carboxypyridyl)iridium III (FIrPic) that is a blue light-emitting material, or the like, and may also include a polymer light-emitting material such as a polyfluorene-based polymer a polyvinyl-based polymer, or the like.

Still referring to FIG. 1, in the first sub-pixel SP1 and the second sub-pixel SP2, the electron acceptor layer 125 is disposed on the third organic emission layer 133. The electron acceptor layer 125 may include any one selected from the group consisting of hexaazatriphenylene hexacarbonitrile (HAT-CN), $MoO_3$ and fullerene (C60). In one embodiment, the electron acceptor layer 125 may include 1,4,5,8,9,11-HAT-CN.

The electron acceptor layer 125 may trap surplus electrons remaining after electrons and holes are recombined.

In the first sub-pixel SP1, the first organic emission layer 131 is formed on the electron acceptor layer 125. The first organic emission layer 131 may emit red visible light and may include tetraphenylnaphthacene (rubrene), tris(1-phenylisoquinoline)iridium(III) ($Ir(piq)_3$), bis(2-benzo[b]thiophene-2-yl-pyridine)(acetylacetonate)iridium(III) ($Ir(btp)_2(acac)$), tris(dibenzoylmethan)phenanthroline europium(III) ($Eu(dbm)_3(phen)$), tris[4,4'-di-tert-butyl-(2,2')-bipyridine]ruthenium(III) complex ($Ru(dtb-bpy)_3*2(PF_6)$), DCM1, DCM2, Eu (thenoyltrifluoroacetone)3 (Eu(TTA)3), butyl-6-(1,1,7,7-tetramethyl julolydyl-9-enyl)-4H-pyran) (DCJTB), or the like, and may also include a polymer light-emitting material such as polyfluorene-based polymer, polyvinyl-based polymer or the like.

In the second sub-pixel SP2, the second organic emission layer 132 is formed on the electron acceptor layer 125. The second organic emission layer 132 may include 3-(2-benzothiazolyl)-7-(diethylamino)coumarin (Coumarin 6 2,3,6,7-tetrahydro-1,1,7,7,-tetramethyl-1H,5H,11H-10-(2-benzothiazolyl)quinolizino-[9,9a,1gh]coumarin (C545T), N,N'-dimethyl-quinacridone (DMQA), or tris(2-phenylpyridine)iridium(III) ($Ir(ppy)_3$) or the like, that is a green light-emitting material, and may also include a polymer light-emitting material such as polyfluorene-based polymer, polyvinyl-based polymer or the like.

In the embodiment of FIG. 1, an electron transport layer 141 and an electron injection layer 142 are disposed on the organic emission layer 130 across all of the sub-pixels. In other embodiments, the electron transport layer 141 and the electron injection layer 142 may not be disposed, or one of them may be disposed.

The second electrode 150 is disposed on the electron injection layer 142. In various embodiments, the second electrode 150 may be a transmissive electrode or a reflective electrode. In embodiments where the second electrode 150 is a transmissive electrode, a metal having a small work function, such as Ag, Mg, Al, Pt, Pd, Au, Ni, Nd, Ir, Cr, Li, Ca, and the like, or a combination thereof, is deposited on the electron injection layer 142, and an auxiliary electrode layer or a bus electrode line, which is formed of a transparent conductive material such as indium tin oxide (ITO), indium zinc oxide (IZO), ZnO, In2O3, or the like, may be formed on the metal.

In embodiments where the second electrode 150 is a reflective electrode, the second electrode 150 may be formed of a metal having a small work function such as Ag, Mg, Al, Pt, Pd, Au, Ni, Nd, Ir, Cr, Li, Ca, or the like.

A sealing member (not shown) may be disposed on the second electrode 150 so as to face the substrate 101. The sealing member may be formed to protect the organic emission layer from external moisture and oxygen. The sealing member may be formed of a transparent material. In some embodiments, the sealing member may be formed of glass, plastic, or a stack structure including a plurality of layers formed of organic or inorganic materials.

In the embodiment of the organic light-emitting display apparatus 100 in FIG. 1, the electron acceptor layer 125 is disposed between the third organic emission layer 133 and the first organic emission layer 131 of the first sub-pixel SP1, and between the third organic emission layer 133 and the second organic emission layer 132 of the second sub-pixel SP2.

The electron acceptor layer 125 may prevent electrons injected through the second electrode 150 from passing through the first organic emission layer 131, the second organic emission layer 132, and the third organic emission layer 133 and from entering the hole transport layer 122 and the hole injection layer 121.

Electrons injected through the second electrode 150 in the first sub-pixel SP1 are recombined with holes in the first organic emission layer 131, and surplus electrons are trapped in the electron acceptor layer 125. The electron acceptor layer 125 prevents the surplus electrons from moving toward the third organic emission layer 133 and/or the hole transport layer 122. Electrons are recombined with holes in the second organic emission layer 132 of the second sub-pixel SP2, and surplus electrons are trapped in the electron acceptor layer 125. The electron acceptor layer 125 prevents the surplus electrons from moving toward the third organic emission layer 133 and/or the hole transport layer 122.

By trapping the surplus electrons in the electron acceptor layer 125, the surplus electrons are prevented from entering an undesired organic layer, for example, the third organic emission layer 133, the hole injection layer 121, or the hole transport layer 122, and the life of the organic light-emitting display apparatus 100 may thus be extended. Since the first organic emission layer 131 and the second organic emission layer 132 are closer to the second electrode 150 than the third organic emission layer 133, the life of the organic light-emitting display apparatus 100 may be reduced due to the surplus electrons, and thus the electron acceptor layer 125 may effectively prevent reduction of the life of the organic light-emitting display apparatus 100.

Electrons injected through the second electrode 150 in the first sub-pixel SP1 are recombined with holes in the first organic emission layer 131, and surplus electrons enter the third organic emission layer 133 and are recombined with holes in the third organic emission layer 133, thereby emitting blue visible light. Thus, visible light including blue visible light and red visible light may be emitted in the first sub-pixel SP1. Similarly, in the second sub-pixel SP2, surplus electrons are recombined with holes in the third organic emission layer 133, and thus mixed visible light, not a desirable green visible light, may be emitted in the second sub-pixel SP2.

The color mixture of the visible light may remarkably deteriorate image quality of the organic light-emitting display apparatus 100. However, the electron acceptor layer 125 is disposed between the first organic emission layer 131 and the third organic emission layer 133 and between the second organic emission layer 132 and the third organic emission layer 133, so as to trap surplus electrons, thereby preventing the color mixture of the visible light, and consequently the image quality of the organic light-emitting display apparatus 100 may be improved.

In addition, a distance between the first electrode 110 and the second electrode 150 is different in each sub-pixel, so that an optical path length of visible light generated from the organic emission layer 130 may be different in each sub-pixel, and thus a microcavity effect may be realized.

Figure 2:
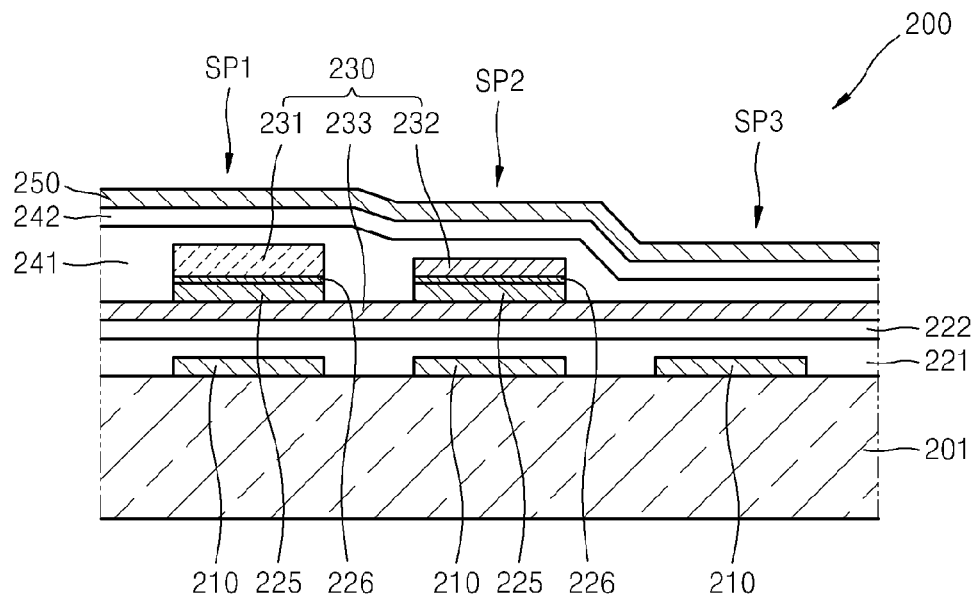
FIG. 2 is a schematic cross-sectional view of another embodiment of an organic light-emitting display apparatus.

FIG. 2 is a schematic cross-sectional view of another embodiment of an organic light-emitting display apparatus 200.

The organic light-emitting display apparatus 200 includes a first sub-pixel SP1, a second sub-pixel SP2, and a third sub-pixel SP3. The first, second, and third sub-pixels SP1, SP2 and SP3 may be sub-pixels of different colors, and in one embodiment, the first sub-pixel SP1 may be red, the second sub-pixel SP2 may be green, and the third sub-pixel SP3 may be blue.

In the embodiment of FIG. 2, one first sub-pixel SP1, one second sub-pixel SP2, and one third sub-pixel SP3 are illustrated. In other embodiments, the organic light-emitting display apparatus 200 may include a plurality of first sub-pixels SP1, a plurality of second sub-pixels SP2, and a plurality of third sub-pixels SP3.

The first sub-pixel SP1 includes a first electrode 210, a third organic emission layer 233, an electron acceptor layer 225, a buffer layer 226, a first organic emission layer 231, and a second electrode 250. The second sub-pixel SP2 includes a first electrode 210, the third organic emission layer 233, an electron acceptor layer 225, a buffer layer 226, a second organic emission layer 232, and the second electrode 250. The third sub-pixel SP3 includes a first electrode 210, the third organic emission layer 233, and the second electrode 250.

The first electrode 210 is formed on a substrate 201. Components of the substrate 201 and the first electrode 210 may be the same as those of the above-described embodiment.

In some embodiments, a hole injection layer 221 and a hole transport layer 222 are formed on the first electrode 210. In other embodiments, the hole injection layer 221 and the hole transport layer 222 may not be formed, or one of them may be formed.

An organic emission layer 230 is formed on the hole transport layer 222. The organic emission layer 230 includes the first organic emission layer 231, the second organic emission layer 232 and the third organic emission layer 233.

The third organic emission layer 233 is formed on the hole transport layer 222 across all of the first sub-pixel SP1, the second sub-pixel SP2, and the third sub-pixel SP3.

The third organic emission layer 233 emits blue visible light and its components are the same as those of the above-described embodiment.

In the first sub-pixel SP1 and the second sub-pixel SP2, the buffer layer 226 and the electron acceptor layer 225 are disposed on the third organic emission layer 233. The buffer layer 226 is disposed between the first organic emission layer 231 and the electron acceptor layer 225.

The electron acceptor layer 225 may include any one selected from the group consisting of HAT-CN, $MoO_3$, and C60. In one embodiment, the electron acceptor layer 225 may include 1,4,5,8,9,11-HAT-CN.

The buffer layer 226 includes a hole transport material or a hole injection material. The buffer layer 226 controls the amount of electrons trapped in the electron acceptor layer 225.

The first organic emission layer 231 is formed on the buffer layer 226 in the first sub-pixel SP1. The first organic emission layer 231 emits red visible light, and its components are the same as those of the above-described embodiment.

The second organic emission layer 232 is formed on the buffer layer 226 in the second sub-pixel SP2. The second organic emission layer 232 emits green visible light and its components are the same as those of the above-embodiment.

In some embodiments, an electron transport layer 241 and an electron injection layer 242 are disposed on the organic emission layer 230 across all the sub-pixels. In other embodiments, the electron transport layer 241 and the electron injection layer 242 may not be disposed, or one of them may be disposed.

The second electrode 250 is disposed on the electron injection layer 242. A sealing member (not shown) may be disposed on the second electrode 250. The second electrode 250 and the sealing member are the same as those of the above-described embodiment, and thus a detailed description thereof will be omitted here.

In the embodiment of the organic light-emitting display apparatus 200 of FIG. 2, the electron acceptor layer 225 is disposed between the third organic emission layer 233 and the first organic emission layer 231 of the first sub-pixel SP1, and between the third organic emission layer 233 and the second organic emission layer 232 of the second sub-pixel SP2. Surplus electrons are trapped in the electron acceptor layer 225, and consequently, the life of the organic light-emitting display apparatus 200 is extended. Also, in the first sub-pixel SP1 and the second sub-pixel SP2, the electron acceptor layer 225 prevents surplus electrons from recombining with holes in the third organic emission layer 233 and thus prevents light from being emitted so as to prevent color mixture, and consequently, the image quality of the organic light-emitting display apparatus 200 may be improved.

Such an effect may be improved because of the buffer layer 226. Electrons injected through the second electrode 250 in the first sub-pixel SP1 are recombined with holes in the first organic emission layer 231, and thus, emit red visible light. Electrons that contribute to the recombination in the first organic emission layer 231 may be reduced due to the electron acceptor layer 225.

The buffer layer 226 may be disposed between the first organic emission layer 231 and the electron acceptor layer 225 so as to control electrons to move from the first organic emission layer 231 to the electron acceptor layer 225. Thus, an efficiency of recombination between the electrons and the holes in the first organic emission layer 231 may be improved.

As a result, an increase in image quality and life of the organic light-emitting display apparatus 200 may be expected.

In addition, a distance between the first electrode 210 and the second electrode 250 is different in each sub-pixel, so that an optical path length of visible light generated from the organic emission layer 230 may be different in each sub-pixel, and thus a microcavity effect may be realized.

Figure 3:
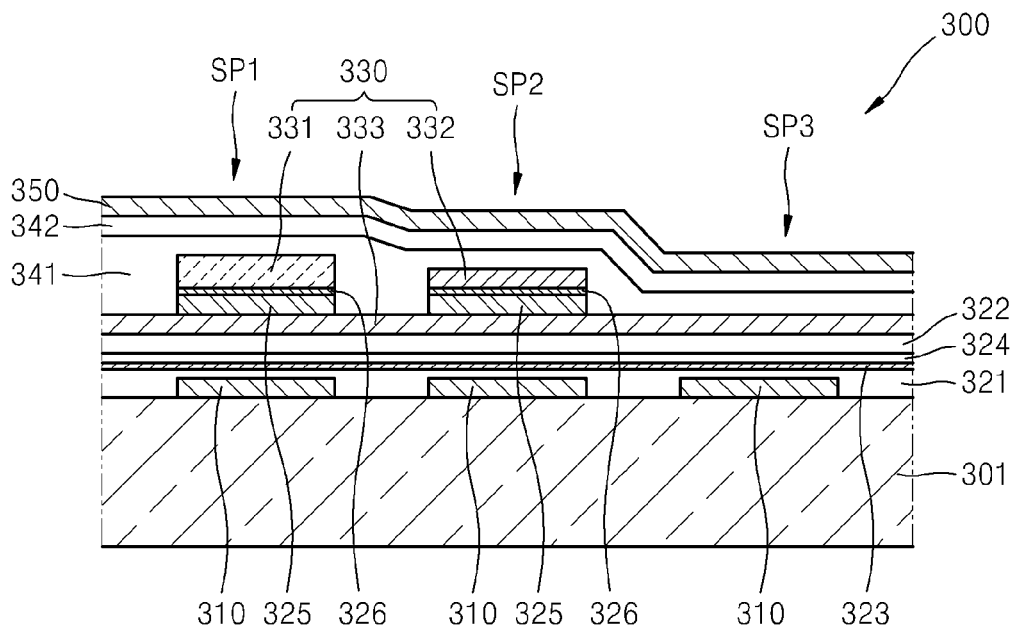
FIG. 3 is a schematic cross-sectional view of another embodiment of an organic light-emitting display apparatus.

FIG. 3 is a schematic cross-sectional view of another embodiment of an organic light-emitting display apparatus 300.

The organic light-emitting display apparatus 300 includes a first sub-pixel SP1, a second sub-pixel SP2, and a third sub-pixel SP3. The first, second, and third sub-pixels SP1, SP2 and SP3 may be sub-pixels of different colors. In one embodiment, the first sub-pixel SP1 may be red, the second sub-pixel SP2 may be green, and the third sub-pixel SP3 may be blue.

In the embodiment of FIG. 3, one first sub-pixel SP1, one second sub-pixel SP2, and one third sub-pixel SP3 are illustrated. In other embodiments, the organic light-emitting display apparatus 300 may include a plurality of first sub-pixels SP1, a plurality of second sub-pixels SP2, and a plurality of third sub-pixels SP3.

The first sub-pixel SP1 includes a first electrode 310, an intermediate layer 323, a third organic emission layer 333, an electron acceptor layer 325, a buffer layer 326, a first organic emission layer 331, and a second electrode 350. The second sub-pixel SP2 includes a first electrode 310, an intermediate layer 323, the third organic emission layer 333, an electron acceptor layer 325, a buffer layer 326, a second organic emission layer 332, and the second electrode 350. The third sub-pixel SP3 includes the intermediate layer 323, a first electrode 310, the third organic emission layer 333, and the second electrode 350.

The first electrode 310 is formed on a substrate 301. Components of the substrate 301 and the first electrode 310 are the same as those of the above-described embodiment.

A hole injection layer 321 and a hole transport layer 322 are formed on the first electrode 310. The intermediate layer 323 is disposed between the hole injection layer 321 and the hole transport layer 322. The intermediate layer 323 may include any one selected from the group consisting of HAT-CN, $MoO_3$, and C60. In one embodiment, the intermediate layer 323 may include 1,4,5,8,9,11-HAT-CN.

The HAT-CN, $MoO_3$, and C60 may trap electrons and may also have an excellent hole transport capability. Therefore, the intermediate layer 323 is disposed between the hole injection layer 321 and the hole transport layer 322, so that holes injected through the first electrode 310 may easily move toward the organic emission layer 330.

In some embodiments, an auxiliary layer 324 including a hole transport material or a hole injection material may be disposed between the intermediate layer 323 and the hole transport layer 322.

The organic emission layer 330 is formed on the hole transport layer 322. The organic emission layer 330 includes the first organic emission layer 331, the second organic emission layer 332, and the third organic emission layer 333.

The third organic emission layer 333 is formed on the hole transport layer 322 across all of the first sub-pixel SP1, the second sub-pixel SP2, and the third sub-pixel SP3.

The third organic emission layer 333 emits blue visible light and its components are the same as those of the above-described embodiments.

In the first sub-pixel SP1 and the second sub-pixel SP2, the buffer layer 326 and the electron acceptor layer 325 are disposed on the third organic emission layer 333.

The electron acceptor layer 325 may include any one selected from the group consisting of HAT-CN, $MoO_3$, and C60. In one embodiment, the electron acceptor layer 325 may include 1,4,5,8,9,11-HAT-CN.

The buffer layer 326 may include a hole transport material or a hole injection material.

The first organic emission layer 331 is formed on the buffer layer 326 in the first sub-pixel SP1. The first organic emission layer 331 emits red visible light, and its components are the same as those of the above-described embodiments.

The second organic emission layer 332 is formed on the buffer layer 326 in the second sub-pixel SP2. The second organic emission layer 332 emits green visible light and its components are the same as those of the above-embodiments.

An electron transport layer 341 and an electron injection layer 342 are disposed on the organic emission layer 330 across all the sub-pixels. In some embodiments, the electron transport layer 341 and the electron injection layer 342 may not be disposed, or one of them may be disposed.

The second electrode 350 is disposed on the electron injection layer 342. A sealing member (not shown) may be disposed on the second electrode 350. The second electrode 350 and the sealing member are the same as those of the above-described embodiments.

In the embodiment of the organic light-emitting display apparatus 300 of FIG. 3, the electron acceptor layer 325 is disposed between the third organic emission layer 333 and the first organic emission layer 331 of the first sub-pixel SP1 and between the third organic emission layer 333 and the second organic emission layer 332 of the second sub-pixel SP2. Thus, surplus electrons are trapped in the electron acceptor layer 325, thereby extending the life of the organic light-emitting display apparatus 300, preventing color mixture, and improving the image quality of the organic light-emitting display apparatus 300. An increase in image quality and life of the organic light-emitting display apparatus 300 may be improved because of the buffer layer 326.

In addition, in the organic light-emitting display apparatus 300, the intermediate layer 323 formed of the same material as the electron acceptor layer 325 is formed between the hole injection layer 321 and the hole transport layer 322, and thus hole transport efficiency may be improved because of the intermediate layer 323. Thus, the efficiency of recombination between the electrons and the holes in the organic emission layer 330 may be improved, and consequently light efficiency of the organic light-emitting display apparatus 300 may be improved.

In addition, an optical path length of visible light is different in each sub-pixel, and thus a microcavity effect may be realized.

Figure 4:
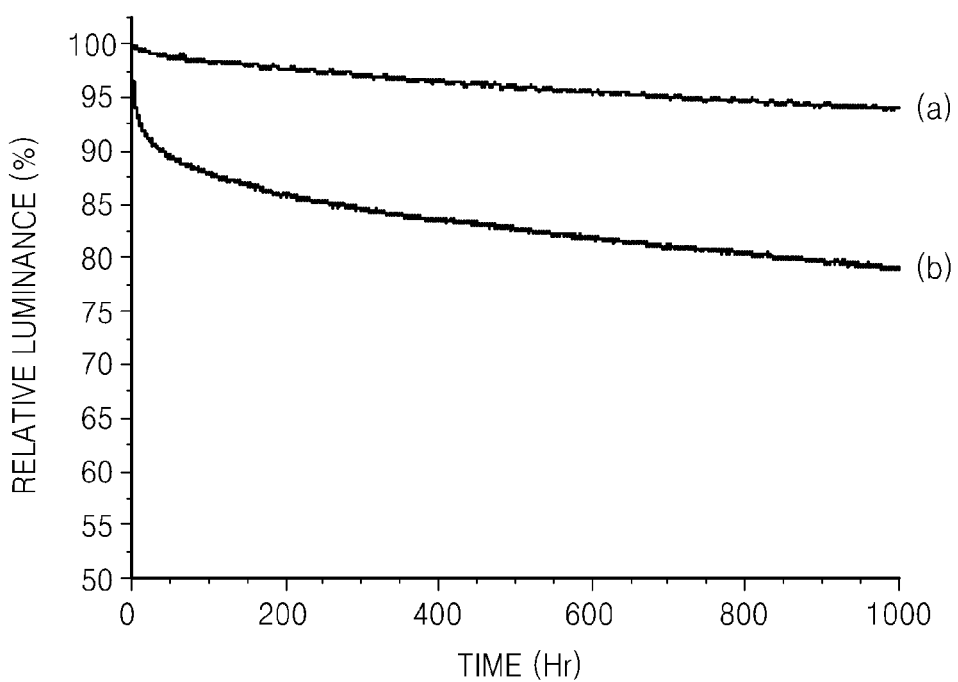
FIG. 4 is a graph illustrating the life of an embodiment of an organic light-emitting display apparatus.

FIG. 4 is a graph illustrating life of an embodiment of the organic light-emitting display apparatus. FIG. 4 illustrates a relative luminance of the organic light-emitting display apparatus over time. The relative luminance is an indicator representing life of the organic light-emitting display apparatus, and is the ratio of luminance at a given time compared to a luminance at the initial time. In FIG. 4, curve (a) is an example of the relative luminance of an embodiment of the organic light-emitting display apparatus, and curve (b) is an example of the relative luminance of a conventional organic light-emitting display apparatus, which does not include an electron acceptor layer.

Referring to curve (a) of FIG. 4, if the organic light-emitting display apparatus is continuously used for 1000 hours, the relative luminance is about 95%. That is, if 1000 hours has elapsed, the relative luminance is decreased by about 5%, compared to the initial luminance. Referring to curve (b) of FIG. 4, when the organic light-emitting display apparatus is continuously used for 1000 hours, the relative luminance is about 80%. That is, when 1000 hours has elapsed, the relative luminance is decreased by about 20%, compared to the initial luminance.

As illustrated in FIG. 4, the life of embodiments of the organic light-emitting display apparatus is remarkably extended because luminance is reduced less over time.

Embodiments of the organic light emitting display apparatus improve the image quality and life of the apparatus.

While the present invention has been particularly shown and described with reference to certain exemplary embodiments thereof, it will be understood by those of ordinary skill in the art that various changes in form and details may be made therein without departing from the spirit and scope.

What is claimed is:

1. An organic light-emitting display apparatus comprising:
a first sub-pixel, a second sub-pixel, and a third sub-pixel, wherein each of said first, second and third sub-pixels displays a different color;
a substrate;
a first electrode disposed on the substrate;
a second electrode disposed on the first electrode, facing the first electrode;
an organic emission layer disposed between the first electrode and the second electrode, comprising a first organic emission layer, a second organic emission layer, and a third organic emission layer; and
an electron acceptor layer disposed between the first electrode and the second electrode configured to contact the organic emission layer,
wherein the first organic emission layer is disposed in the first sub-pixel, the second organic emission layer is disposed in the second sub-pixel, and the third organic emission layer is commonly disposed over the first sub-pixel, the second sub-pixel, and the third sub-pixel; and
wherein the electron acceptor layer is disposed only between the first organic emission layer and the third organic emission layer in the first sub-pixel and between the second organic emission layer and the third organic emission layer in the second sub-pixel.

2. The organic light-emitting display apparatus of claim 1, wherein the first organic emission layer emits red visible light, the second organic emission layer emits green visible light, and the third organic emission layer emits blue visible light.

3. The organic light-emitting display apparatus of claim 1, wherein the electron acceptor layer comprises one of hexaazatriphenylene hexacarbonitrile (HAT-CN), $MoO_3$, and fullerene (C60).

4. The organic light-emitting display apparatus of claim 1, wherein the third organic emission layer is disposed between the first electrode and the first organic emission layer, and further disposed between the first electrode and the second organic emission layer.

5. The organic light-emitting display apparatus of claim 1, wherein a hole transport layer and a hole injection layer are disposed between the substrate and the third organic emission layer.

6. An organic light-emitting display apparatus according to claim 1, further comprising:
a buffer layer between the electron acceptor layer and the first organic emission sublayer, and between the electron acceptor layer and the second organic emission sublayer.

7. The organic light-emitting display apparatus of claim 6, wherein the first organic emission sublayer emits red visible light, the second organic emission sublayer emits green visible light, and the third organic emission sublayer emits blue visible light.

8. The organic light-emitting display apparatus of claim 6, wherein the electron acceptor layer comprises one of hexaazatriphenylene hexacarbonitrile (HAT-CN), $MoO_3$, and fullerene (C60).

9. The organic light-emitting display apparatus of claim 6, wherein the third organic emission sublayer is disposed between the first electrode and the first organic emission sublayer, and further disposed between the first electrode and the second organic emission sublayer.

10. The organic light-emitting display apparatus of claim 6, wherein the buffer layer comprises one of a hole injection material and a hole transport material.

11. The organic light-emitting display apparatus of claim 6, further comprising a hole transport layer and a hole injection layer.

* * * * *

UNITED STATES PATENT AND TRADEMARK OFFICE
CERTIFICATE OF CORRECTION

PATENT NO. : 8,581,270 B2  Page 1 of 1
APPLICATION NO. : 13/069039
DATED : November 12, 2013
INVENTOR(S) : Jin-Woo Park et al.

It is certified that error appears in the above-identified patent and that said Letters Patent is hereby corrected as shown below:

In the Specification

At column 2, line 22, please delete "polyethersulphone", and insert -- Polyethersulfone --, therefor.

At column 3, line 23-24, please delete "polyethyelenen napthalate", and insert -- polyethylene naphthalate --, therefor.

At column 3, line 24, please delete "polyethyeleneterepthalate", and insert -- polyethyleneterephthalate --, therefor.

At column 4, line 11, please delete "b is", and insert -- bis --, therefor.

At column 4, line 34, please delete "dibenzoylmethan", and insert -- dibenzoylmethane--, therefor.

At column 4, line 38, please delete "julolydyl", and insert -- julolidyl --, therefor.

Signed and Sealed this
Fifteenth Day of July, 2014

Michelle K. Lee
*Deputy Director of the United States Patent and Trademark Office*